US006329883B1

United States Patent
Pacourek

(10) Patent No.: US 6,329,883 B1
(45) Date of Patent: Dec. 11, 2001

(54) METHOD AND SYSTEM FOR CONTROLLING A TUNING VOLTAGE OF A PHASE-LOCKED LOOP CIRCUIT TO AN OPTIMAL VALUE

(75) Inventor: John Robert Pacourek, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 09/703,957

(22) Filed: Nov. 1, 2000

(51) Int. Cl.⁷ ................................................ H03L 7/093
(52) U.S. Cl. .............................. 331/17; 331/25; 327/156
(58) Field of Search .................................... 331/8, 15, 17, 331/18, 23, 25, 34; 327/156–159

(56) References Cited

U.S. PATENT DOCUMENTS

| | | | |
|---|---|---|---|
| 5,446,411 | * 8/1995 | Horsfall et al. | 329/325 |
| 5,504,459 | * 4/1996 | Gersbach et al. | 331/17 |
| 5,604,465 | * 2/1997 | Farabaugh | 331/10 |
| 5,907,263 | 5/1999 | Divine et al. | |
| 6,275,115 | * 8/2001 | Egawa | 331/11 |

* cited by examiner

Primary Examiner—David Mis

(74) Attorney, Agent, or Firm—Steven Lin

(57) ABSTRACT

A method and system for controlling a tuning voltage of a phase-locked loop circuit to an optimal value are disclosed. Minimum and maximum bias current values are defined for a bias current from the linear control loop circuit. The linear control loop circuit is coupled to the phase-locked loop circuit. The linear control loop circuit infinitely varies a current value for a current-controlled oscillator of the phase-locked loop circuit. The current value is based on a tuning current of the phase-locked loop circuit and the bias current. The bias current infinitely varies in value between the minimum bias current value and the maximum bias current value to direct the tuning voltage to an optimal value. The phase-locked loop circuit includes a phase detector, a filter, a voltage-to-current converter, a current adder, and the current-controlled oscillator coupled together in series. The linear control loop circuit is an analog, voltage control loop that has a voltage summer, another filter, and another voltage-to-current converter coupled together in series. A reference voltage and the tuning voltage are inputted into the voltage summer, and a bias current is outputted and injected from the other voltage-to-current converter into the tuning current. The other voltage-to-current converter has a sufficient gain to provide the bias current between the minimum bias current value and the maximum bias current value. The linear control loop circuit is designed with a time constant characteristic that is slower than another time constant characteristic of the phase-locked loop circuit.

19 Claims, 4 Drawing Sheets

METHOD AND SYSTEM FOR CONTROLLING A TUNING VOLTAGE OF A PHASE-LOCKED LOOP CIRCUIT TO AN OPTIMAL VALUE

BACKGROUND OF THE INVENTION

1. Technical Field

The present invention relates in general to a phase-locked loop ("PLL") circuit, and, in particular, to a linear control loop for controlling a tuning voltage of a PLL circuit. Still more particularly, the present invention relates to a method and system for controlling a tuning voltage of a PLL circuit to an optimal value.

2. Description of the Related Art

A phase-locked loop ("PLL") circuit is generally a circuit that has an oscillator, which outputs a phase that automatically adjusts in synchronization with an input oscillator signal. The PLL circuit receives an input reference frequency from a signal and outputs a signal having a frequency that is a multiple of the input reference frequency. The PLL circuit is utilized to lock the output frequency to be in phase with the input frequency. Locking the output and input frequencies to be in phase is very critical in developing accurate and precise clocks that are used by digital signal processors ("DSPs") and for audio sampling frequencies and rates.

Various non-ideal factors ("non-idealities"), such as temperature, supply voltage, non-typical process parameters, etc., may affect the operation of the PLL circuit. A tuning voltage circuit is coupled to the PLL circuit to adjust and/or control the tuning voltage for the PLL circuit in eliminating or minimizing the effects of the non-idealities on the operation of the PLL circuit. Various tuning voltage circuits for PLL circuits exist.

With reference now to FIG. 1, an exemplary tuning voltage ("TV") circuit 100, that is a digital control loop, for a PLL circuit 101 is shown. TV circuit 100 and PLL circuit 101 are driven by a power source(s) $V_s$ and are also coupled to ground. TV circuit 100 has a first voltage comparator 128, a second voltage compartor 132, a digital control unit 136, and a discrete current source 140. First and second voltage comparators 128 and 132 are coupled to inputs of digital control unit 136, and discrete current source 140 is coupled to an output of digital control unit 136. PLL circuit 101 includes a phase detector 106, a loop filter 110, a voltage-to-current ("V-TO-I") converter 112, a current adder 116, and a current controlled oscillator ("ICO") 120 coupled together in series. Tuning voltage ("TV") 126 is the voltage level at the output of loop filter 110 and the input of V-to converter 112. TV 126 is fed into a positive input terminal 128A of first voltage comparator 128, and a maximum reference voltage ("VMAX") 124 is fed into a negative input terminal 128B of first voltage comparator 128. Furthermore, TV 126 is fed into a negative input terminal 132A of second voltage comparator 132, and a minimum reference voltage ("VMIN") 122 is fed into a positive input terminal 132B. The values for VMIN 122 and VMAX 124 are determined and set by design methods and factors that are known in the art. An optimal voltage ("VOPTIMUM") 208 (see FIG. 2) is also defined for TV 126, which may be defined as the half-way value between VMIN 122 and VMAX 124. An IBIAS(N) current 142 outputted from discrete current source 140 is fed into current adder 116.

Reference phase $\phi_i$ 102 of an input frequency signal is fed into phase detector 106. Phase detector 106 compares reference phase $\phi_i$ 102 with a fed-back output phase signal ("$\phi_0$") 104 from ICO 120. Phase detector 106 generates a phase error ("$\phi_e$") 108, which is the difference in phase between what the phase of the signal currently is (e.g., phase signal "$\phi_0$104) and what the phase should be based on reference phase $\phi_i$ 102. Phase error ("$\phi_e$") 108 is sent to loop filter 110. Loop filter 110 filters voltages by passing some voltages at certain frequencies while attenuating other voltages at other frequencies. Loop filter 110 provides TV 126. TV 126 is inputted into V-to-I converter 112, and V-to-I converter 112 converts TV 126 to a tuning current ("ITUNE") 114. ITUNE 114 is passed to current adder 116, which adds a bias current ("IBIAS(I)") 142, if any, based on any difference between TV 126 and a normal operating or optimum voltage, from TV circuit 100. Current adder 116 outputs a current ("IICO") 118 for controlling current-controlled oscillator ("ICO") 120. IICO 118 is inputted into ICO 120. ICO 120 provides an output phase $\phi_0$ 104 that is supposedly synchronized in phase with reference phase $\phi_i$ 102 and which is also fed back to phase detector 106 to check for any further phase error.

Referring now to FIG. 2, graph 200 for the current-voltage characteristics of IICO 118 and TV 126 for TV circuit 100 and PLL circuit 101 of FIG. 1 is shown. TV 126 is defined with the boundary values of VMIN 122 and VMAX 124, which are the voltage values set for TV 126 and that TV 126 is to be kept within during the operation of PLL circuit 101. In FIG. 2, graph 200 shows that, under normal operation, PLL circuit 101 follows the characteristic of IBIAS(NORMAL)+ITUNE curve 215. Since TV circuit 100 is a digital control loop, IBIAS(I) 142 is interjected in discrete intervals (e.g., discrete IBIAS current increments) by TV circuit 100 from a zero discrete value to "N" discrete values. An "I" variable is defined as the variable value 138 in FIG. 1 for IBIAS(I) 142 that may be varied from integer values "0 to N" for representing the number of IBIAS increments that needs to be injected to ITUNE 114. For each IBIAS increment of IICO 118, ITUNE curve 212 with no IBIAS increment, in effect, is displaced by and re-plotted at a next incremental IBIAS current value(s) from ITUNE curve 212. Graph 200 illustrates the discrete increments by showing current-voltage curves 212 to 220 (e.g., ITUNE 212; "IBIAS1+ITUTNE" 214; "IBIAS2+ITUNE" 216 . . . "IBIAS(NORMAL)+ITUNE 215" . . . "IBIAS(N–1)+ITUNE" 218; "IBIAS(N)+ITUNE" 220) plotted parallel to each other, in which each curve is separated from the other by an incremental IBIAS current value.

The optimal point under normal operation of PLL circuit 101 is at point A on curve IBIAS(NORMAL)+ITUNE curve 215. Point A represents TV 126 equal to VOPTIMUM 208. However, PLL circuit 101 may not typically operate under normal conditions, and non-idealities may cause PLL circuit 101 to operate along IBIAS1+ITUNE curve 214 at point B. TV 126 is then set at a locked TV value 209, which corresponds to a locked IICO current 222, under which PLL circuit 101 operates. When further non-idealities are introduced into PLL circuit 101, TV 126 may increase or decrease in value. TV 126 may increase or decrease in value such that, before reaching VMAX 124 or VMIN 122, operation of PLL circuit 101 is immediately and respectively forced to move up or down to another curve (e.g., move up to IBIAS(I+1) +ITUNE curve or move down to IBIAS(I–1)+ITUNE curve).

For example, FIG. 2 illustrates that if TV 126 increases in value, then the operating point of PLL circuit 101 shifts from point B towards point C in which TV 126 attempts to become a "VC" value 230 that is above VMAX 124. However, when TV 126 reaches VMAX 124, IBIAS(I) 142 is immediately increased from IBIAS1 to IBIAS2 in order for PLL circuit 101 to shift from attempting to operate at point C on "IBIAS1+ITUNE" 214 to operating at point D on "IBIAS2 +ITUNE" 216. TV 126 becomes a "VD" value 232 that is again within the range between VMIN 122 and VMAX 124 and that provides the same value of IICO 118 at point C. Conversely, if TV 126 decreases in value, then the operating point of PLL circuit 101 may attempt to shift below (e.g., to the left) of VMIN 122. IBIAS(I) 142 is then immediately decreased in order for PLL circuit 101 to shift from attempting to operate on the current curve in which the operating point would have TV 126 be lower than VMIN 122 to a lower curve in which TV 126 is within the range of VMIN 122 and VMAX 124.

Referring back to FIG. 1, first voltage comparator 128 compares whether TV 126 is attempting to exceed VMAX 124. If it is attempting to exceed VMAX 124, then comparator 128 immediately sends an incremental signal 130 that sets an incremented value (e.g., an integer value between zero and "N") for the I integer variable to digital control unit 136. Digital control unit 136 sends incremented value for integer variable I to discrete current source 140. Discrete current source 140 provides a total discrete IBIAS (I) current 142 (e.g., "IBIAS2") that is determined to be a product of the incremented I variable value (e.g., I=2) and an IBIAS incremental unit value. Second voltage comparator 132 compares whether TV 126 is attempting to fall below VMIN 122. If it is attempting to fall below VMIN 122, then comparator 132 immediately sends decremental signal 134 that sets a decremented value (e.g., an integer value between zero and "N") for the I variable to digital control unit 136. The decremented I variable value is then sent from digital control unit 136 to discrete current source 140. Discrete current source 140 provides a total discrete IBIAS(I) current 142 that is determined as a product of the decremented I variable value and an IBIAS incremental unit value. IBIAS (I) 142 is then added to ITUNE 114 at current adder 116 to produce IICO 118. IICO 118 is inputted into current-controlled oscillator 120.

Tuning voltage circuits, such as digital TV circuit 100, control tuning voltages of PLL circuits that vary between the minimum and maximum values. At times, the tuning voltage also attempts to fall outside of the range between the minimum and maximum values. The variation in value of the tuning voltage affects the PLL circuit precisely and accurately synchronizing the phase of the output and input signals. A limitation of a digital tuning voltage circuit is that it can only bias the current-voltage characteristic curve at discrete levels between a range of values for the bias current. Due to this limitation and the fact that a PLL circuit operates with non-idealities, the PLL circuit at times has to operate at a voltage that is not an optimal voltage. The fixing of the tuning voltage to a particular value or certain range of values would allow the PLL circuit to operate at an optimal voltage and at least precisely and accurately synchronize the phase between its output and input signals. The fixing of the tuning voltage would also allow the design for PLL circuits and tuning circuits to be simplified.

The present invention recognizes the need and desire to eliminate or reduce the variation of the tuning voltage of the PLL circuit despite the introduction of non-idealities into the PLL circuit. The present invention further recognizes the need and desire to improve the precision and accuracy of a PLL circuit synchronizing the phase of the output and input signals. The present invention also recognizes the need and desire to simplify the tuning circuitry for a PLL circuit.

SUMMARY OF THE INVENTION

A method and system for controlling a tuning voltage of a phase-locked loop circuit to an optimal value are disclosed. Minimum and maximum bias current values are defined for a bias current from the linear control loop circuit. The linear control loop circuit is coupled to the phase-locked loop circuit. The linear control loop circuit infinitely varies a current value for a current-controlled oscillator of the phase-locked loop circuit. The current value is based on a tuning current of the phase-locked loop circuit and the bias current. The bias current infinitely varies in value between the minimum bias current value and the maximum bias current value to direct the tuning voltage to an optimal value. The phase-locked loop circuit includes a phase detector, a filter, a voltage-to-current converter, a current adder, and the current-controlled oscillator coupled together in series. The linear control loop circuit is an analog, voltage control loop that has a voltage summer, another filter, and another voltage-to-current converter coupled together in series. A reference voltage and the tuning voltage are inputted into the voltage summer, and a bias current is outputted and injected from the other voltage-to-current converter into the tuning current. The other voltage-to-current converter has a sufficient gain to provide the bias current between the minimum bias current value and the maximum bias current value. The linear control loop circuit is designed with a time constant characteristic that is slower than another time constant characteristic of the phase-locked loop circuit.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DETAILED DESCRIPTION OF ILLUSTRATIVE EMBODIMENT

A method and system for controlling a tuning voltage of a phase-locked loop circuit to an optimal value are disclosed. Minimum and maximum bias current values are defined for a bias current from a linear control loop circuit, that is a tuning voltage circuit which controls the tuning voltage of the phase-locked loop circuit. The linear control loop circuit is coupled to the phase-locked loop circuit. The linear control loop circuit infinitely varies a current value for a current-controlled oscillator of the phase-locked loop circuit. The current value is based on a tuning current of the phase-locked loop circuit and the bias current. The bias current infinitely varies in value between the minimum bias current value and the maximum bias current value to direct the tuning voltage to an optimal value.

Figure 1:
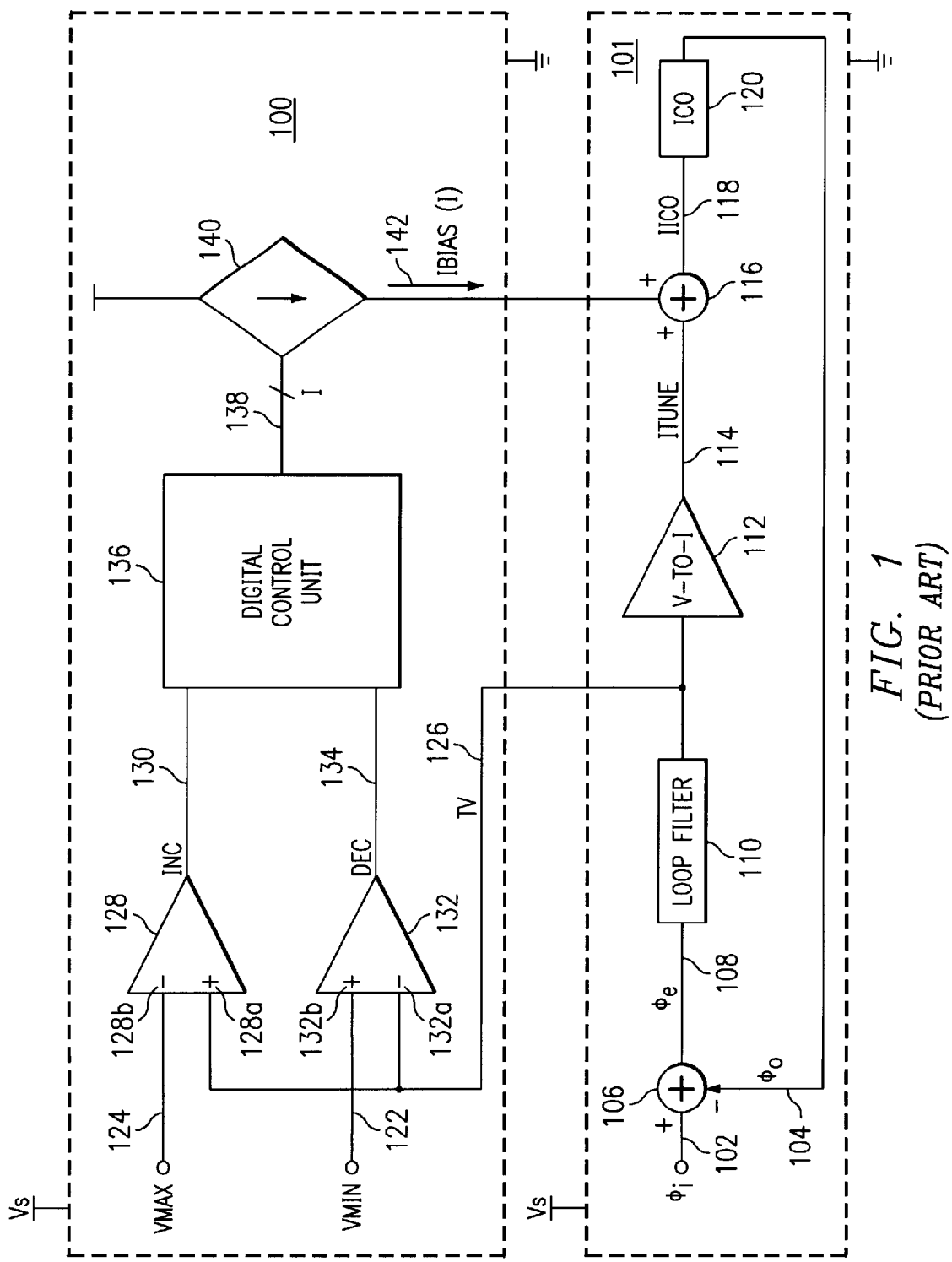
FIG. 1 is a block diagram of an exemplary phase-locked loop ("PLL") circuit having a tuning voltage controlled by a tuning voltage ("TV") circuit in accordance with the prior art.
Figure 2:
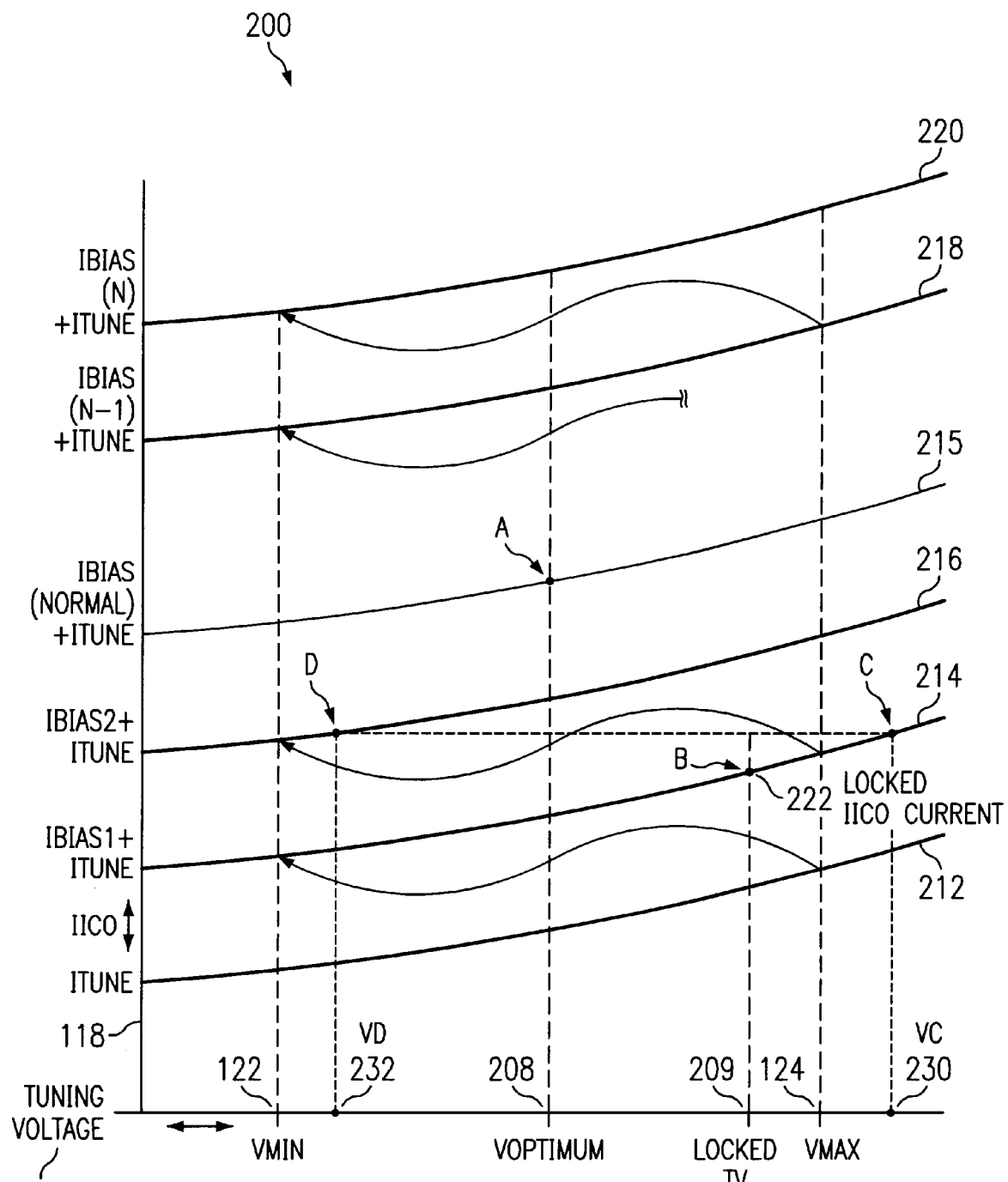
FIG. 2 is a graph of current-controlled oscillator current and tuning voltage of the PLL and TV circuits of FIG. 1 in accordance with the prior art.
Figure 3:
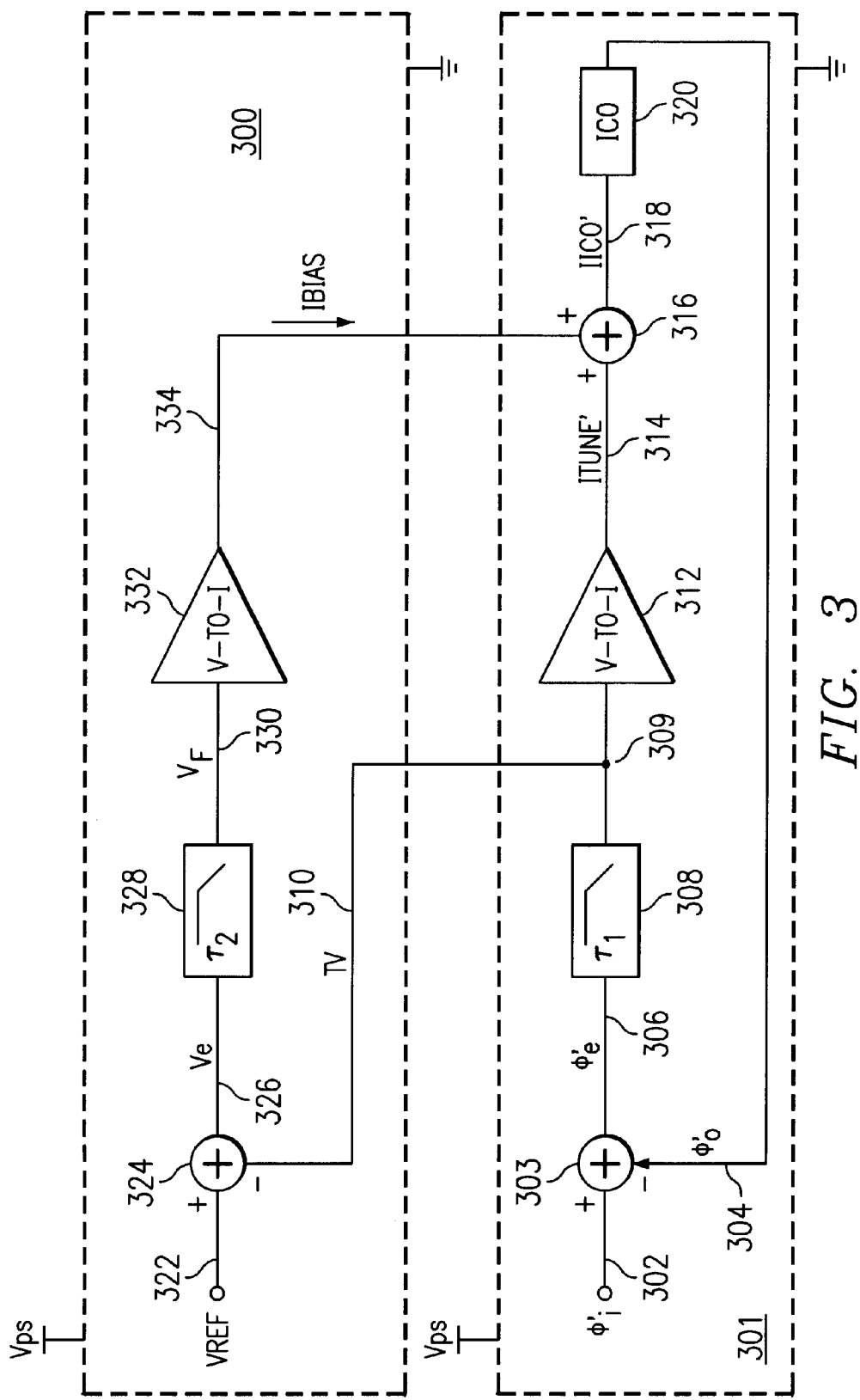
FIG. 3 is a block diagram of an exemplary phase-locked loop ("PLL") circuit having a tuning voltage controlled by a tuning voltage ("TV") circuit in accordance with the present invention.

With reference now to FIG. 3, an exemplary tuning voltage ("TV") circuit 300, which is an analog, linear, and voltage control loop, for controlling a tuning voltage of a phase locked loop ("PLL") circuit 301, in accordance with the present invention, is shown. TV circuit 300 and PLL circuit 301 are driven by a power source(s) $V_{ps}$ and are also coupled to ground. TV circuit 300 has an analog voltage summer 324, a loop filter 328, and a voltage-to-current ("V-to-I") converter 332, which are coupled together in series as shown in FIG. 3. V-to-I converter 332 is designed to have a sufficient gain so that the TV circuit 300 (e.g., linear control loop circuit) is able to provide the bias current in the range between the minimum and maximum bias current values. PLL circuit 301 has a phase detector 303, a loop filter 308, a voltage-to-current ("V-to-I") converter 312, a current adder 316, and a current controlled oscillator ("ICO") 320, which are also coupled together in series as shown in FIG. 3. An output of ICO 320 is fed back to phase detector 303 as also shown in FIG. 3. TV circuit 300 is coupled to PLL circuit 301 at a voltage node 309, which is at a tuning voltage ("TV") level 310. Tuning voltage ("TV") 310 of PLL circuit 301 is the voltage level at the output of loop filter 308 and the input of V-to-I converter 312. TV circuit 300 is also coupled to PLL circuit 301 at an input of current adder 316.

TV circuit 300 is typically designed to be a much slower control loop than PLL circuit 301. For example, loop filter 328 of TV circuit 300 is designed to have a time constant characteristic (e.g., $\tau 2=RC2$) that is at least a thousand times slower than the time constant characteristic (e.g., $\tau 1=RC1$) of loop filter 308 of PLL circuit 301 (e.g., wherein $\tau 2=\tau 1000 \times 1$). This difference in speed between loop filters 328 and 308 is generally achieved by designing the "resistance-capacitance" characteristic (e.g., RC2) of loop filter 328 to be a thousand times larger than the "resistance-capacitance" characteristic (e.g., RC1) of loop filter 308. Therefore, PLL circuit 301 pre-dominates the processing of the phase error over TV circuit 300 processing the voltage error. The design of the speeds of the loops in this manner enables the PLL circuit 301 to properly operate.

Reference phase ("$\phi'_i$") 302 of an input frequency signal is fed into phase detector 303. Phase detector 303 compares reference phase $\phi 40_i$ 302 with fed-back output phase signal ("$\phi'_o$") 304 from ICO 320. Phase detector 303 generates a phase error $\phi'_e$") signal 306, which is the difference in phase between what the phase of the signal currently is (e.g., phase signal $\phi'_o$ 304) and what the phase should be based on reference phase $\phi'_i$ 302. Phase error $\phi'_e$ signal 306 is sent to loop filter 308. Loop filter 308 filters voltages by passing some voltages at certain frequencies while attenuating other voltages at other frequencies. Loop filter 308 provides TV 310. TV 310 is inputted into V-to-I converter 312, and V-to-I converter 312 converts TV 310 into a tuning current ("ITUNE'") 314. ITUNE' 314 is passed to current adder 316, which adds a bias current ("IBIAS") 334, if any, based on TV 310, from TV circuit 300. Current adder 316 outputs a current ("IICO'") 318 for controlling current-controlled oscillator ("ICO") 320. IICO' 318 is the sum of ITUNE' 314 and IBIAS 334, and IICO' 318 is inputted into ICO 320. ICO 320 provides a signal having an output phase $\phi'_o$ 304 that is supposedly synchronized in phase with reference phase $\phi'_i$ 302 and which is also fed back to phase detector 303 to check and adjust for any further phase error.

In FIG. 3, voltage summer 324 receives as inputs a reference voltage ("VREF") 322 and TV 310. VREF 322 is an optimal voltage value for TV 310 under which PLL circuit 301 operates. VREF 322 is generally set to a value based on well-known design methods and factors. Voltage summer 324 compares VREF 322 and TV 310 and outputs a voltage error difference $V_e$. Voltage error difference $V_e$ is inputted into loop filter 328. Loop filter 328 filters voltages by passing some voltages at certain frequencies while attenuating other voltages at other frequencies. From the received voltage error difference $V_e$, loop filter 328 filters and outputs an adjusting voltage $V_F$ 330. Adjusting voltage $V_F$ 330 is fed to V-to-I converter 332. V-to-I converter 332 converts adjusting voltage $V_F$ 330 to a bias current ("IBIAS") 334. For example, if voltage summer 324 determines that TV 310 exceeds VREF 322 in value (e.g., due to non-idealities), then IBIAS current 334 is increased in value to decrease TV 310 back to the optimal VREF 322. Conversely, if voltage summer 324 determines that TV 310 is below VREF 322 in value (e.g., due to non-idealities), then IBIAS 334 is decreased in value to increase TV 310 back to the optimal VREF 322. IBIAS current 334 outputted from V-to-I converter 332 is inputted into current adder 316, and current adder 316 adds IBIAS current 334 to ITUNE' 314 to provide IICO' 318 for ICO 320 as previously discussed.

Figure 4:
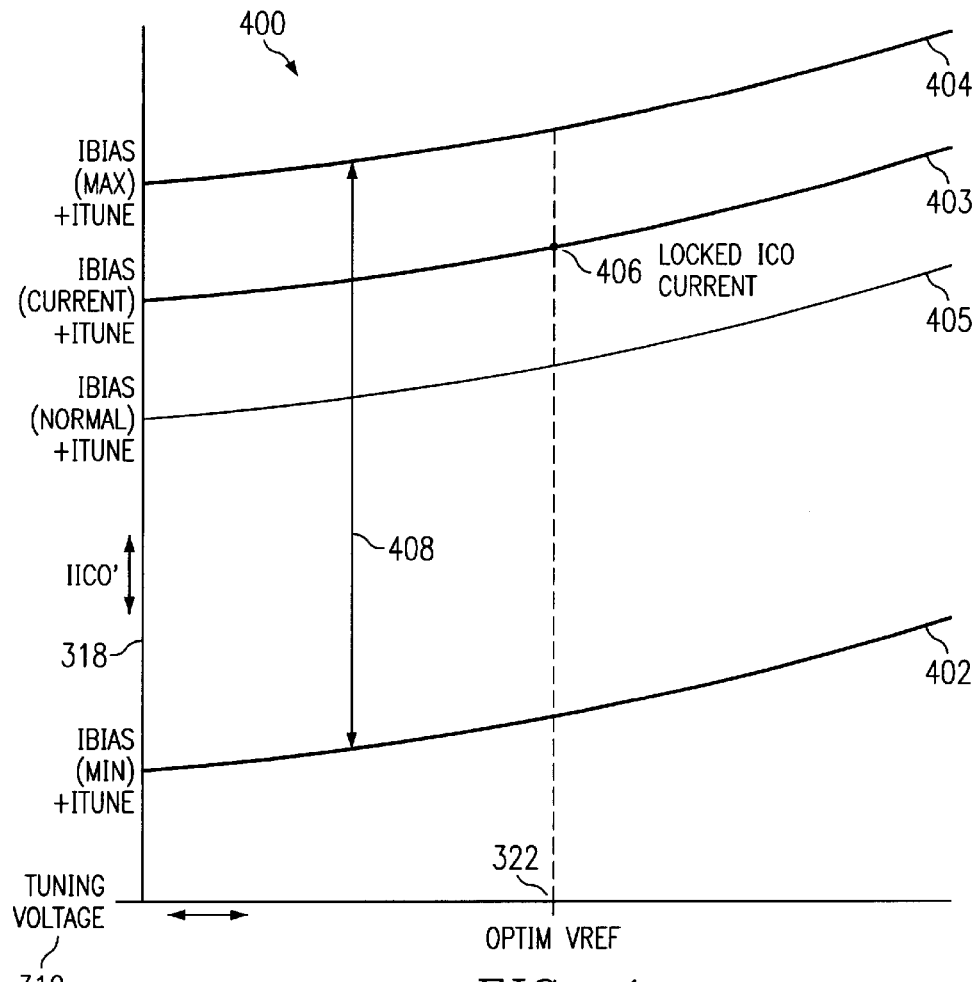
FIG. 4 is a graph of current-controlled oscillator current and tuning voltage of the PLL and TV circuits of FIG. 3 in accordance with the present invention.

Referring now to FIG. 4, graph 400 for the current-voltage characteristics of IICO' 318 and TV 310 for TV circuit 300 and PLL circuit 301 of FIG. 3 is shown. TV circuit 300 can inject any value from an infinite number of values of IBIAS 334 between a minimum bias ("IBIAS (MIN)") current and a maximum bias ("IBIAS(MAX)") current. IBIAS(MIN) and IBIAS(MAX) currents may be set based on well-known design methods and factors of TV circuit 300. In FIG. 4, graph 400 shows that the normal operation of PLL circuit 301 follows the characteristic of a normally biased current ("IBIAS(NORMAL)+ITUNE") curve 405. Since TV circuit 300 is an analog, voltage control loop, IBIAS 334 is infinitely variable to any value between IBIAS(MIN) and IBIAS(MAX) currents. Non-idealities may cause PLL circuit 301 to operate on a curve different from IBIAS(NORMAL)+ITUNE curve 405, such as a current biased current ("IBIAS(CURRENT)+ITUNE") curve 403. IBIAS(CURRENT)+ITUNE curve 403 indicates the current curve for which TV circuit 300 and PLL circuit 301 are operating. As stated earlier, the current value for ICO 320 is based on ITUNE' 314 and IBIAS 334, and IBIAS 334 is infinitely variable between IBIAS(MIN) and IBIAS(MAX). IBIAS(CURRENT)+ITUNE curve 403 shows that ICO current 304 from ICO 320 is locked to the value of ICO current 406 to fix TV 310 to optimal VREF 322. IBIAS (CURRENT)+ITUNE curve 403 may be infinitely displaced to any location along line 408 between IBIAS(MIN)+ITUNE curve 402 and IBIAS(MAX)+ITUNE curve 404 so that TV 310 stays equal to the value of optimal VREF 322. For example, if non-idealities are introduced such that the value of TV 310 exceeds the value of optimal VREF 322, then the value of IBIAS current 334 is increased so that IBIAS(CURRENT) +ITUNE curve 403 moves up graph 400 and TV 310 stays equal to optimal VREF 322. On the other hand, if non-idealities are introduced such that the value of TV 310 is below the value of optimal VREF 322, then the value of IBIAS current 334 is decreased so that IBIAS (CURRENT)+ITUNE curve 403 moves down graph 400 and TV 310 stays equal to optimal VREF 322. IBIAS (CURRENT)+ITUNE curve 403 is moved up and down graph 400 so that TV 310 is, in effect, directed and fixed to optimal VREF 322.

Figure 5:
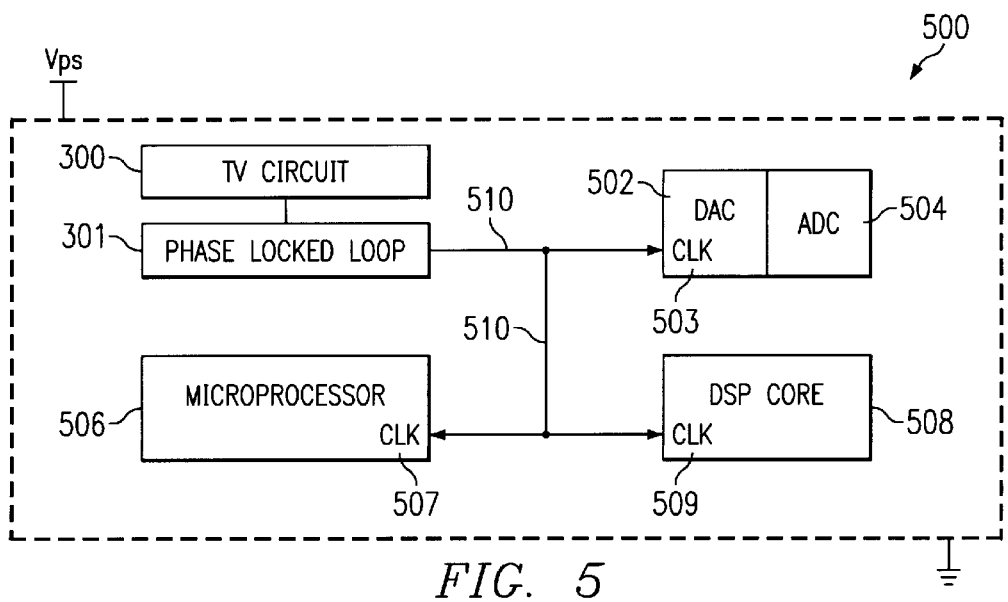
FIG. 5 is a block diagram of the PLL and TV circuits of FIG. 3 being utilized in a digital signal processing application.

With reference now to FIG. 5, a block diagram of PLL circuit 301 and TV circuit 300 of FIG. 3 being utilized in a digital signal processing ("DSP") system 500 is shown. DSP system 500 includes TV circuit 300, PLL circuit 301, a digital-to-analog converter ("DAC") 502, an analog-to-digital converter ("ADC") 504, a microprocessor 506, and a digital signal processing ("DSP") core 508. TV circuit 300 is coupled to PLL circuit 301 (e.g., as previously illustrated in FIG. 3). PLL circuit 301 is coupled to DAC 502, ADC 504, a microprocessor 506, and DSP core 508 via coupling line 510. FIG. 5 shows PLL circuit 301 coupled to DAC 502 and ADC 504 at clock ("CLK") input pin 503 through line 510. DAC 502 converts digital signals to analog signals, and ADC 504 converts analog signals to digital signals. PLL circuit 301 is further coupled to microprocessor 506 at clock ("CLK") input pin 507 via line 510. Microprocessor 506 controls the processing of the signals in DSP system 500. PLL circuit 301 is also coupled to DSP core 508 at clock ("CLK") input pin 509 via line 510. DSP core 508 handles and processes the digital signals. Since PLL circuit 301 fixes its tuning voltage (e.g., TV 310) to an optimal voltage (e.g., VREF 322), PLL circuit 301 is utilized to provide a precise, accurate, and synchronized clock signal for the components, devices, and subsystems systems of DSP system 500.

The present invention eliminates and/or reduces the variation of the tuning voltage of the PLL circuit despite the introduction of non-idealities into the PLL circuit. The present invention improves the precision and accuracy of a PLL circuit synchronizing the phase of the output and input signals by fixing or locking the tuning voltage of the PLL circuit to an optimal reference voltage. The present invention also provides a more simplified circuitry for tuning a PLL circuit. The present invention further provides an analog solution that overcomes the limitations of digital tuning circuitry for a PLL circuit.

The present invention is not in any way limited to a specific PLL circuit or tuning circuit or to being utilized with a specific digital signal processing application, and the present invention may also be utilized with any other suitable circuits, devices, components, or systems or utilized for any suitable application.

While the invention has been particularly shown and described with reference to a preferred embodiment, it will be understood by those skilled in the art that various changes in form and detail may be made therein without departing from the spirit and scope of the invention.

What is claimed is:

1. A method for controlling a tuning voltage of a phase-locked loop circuit to an optimal value, said method comprising:

defining a minimum bias current value and a maximum bias current value for a bias current of a linear control loop circuit controlling a tuning voltage of a phase-locked loop; and infinitely varying, by the linear control loop circuit, a current value for a current-controlled oscillator of the phase-locked loop circuit wherein the current value is based on a tuning current of the phase-locked loop circuit and the bias current, that is able to infinitely vary in value between the minimum bias current value and the maximum bias current value, to direct the tuning voltage to an optimal value.

2. The method according to claim 1, wherein the step of infinitely varying further comprises the step of:

infinitely varying the current value to fix the tuning voltage to the optimal value.

3. The method according to claim 1, further comprising the steps of:

coupling together in series for the phase-locked loop circuit a phase detector, a filter, a voltage-to-current converter, a current adder, and the current-controlled oscillator;

inputting a reference phase value as an input into the phase detector; and feeding a phase output of the current-controlled oscillator as another input back to the phase detector.

4. The method according to claim 3, further comprising the steps of:

coupling together in series for the linear control loop circuit a voltage summer, another filter, and another voltage-to-current converter;

inputting both a reference voltage and the tuning voltage into the voltage summer;

determining, by the voltage summer, a voltage difference between the reference voltage and the tuning voltage;

filtering, by the another filter, the voltage difference;

converting, by the another voltage-to-current converter, the voltage difference into the bias current; and injecting the bias current from the another voltage-to-current converter into the tuning current from the voltage-to-current converter.

5. The method according to claim 1, further comprising the step of:

coupling together in series for the linear control loop circuit a voltage summer, another filter, and another voltage-to-current converter.

6. The method according to claim 5, wherein the another voltage-to-current converter has a sufficient gain for the linear control loop circuit to provide the bias current between the minimum bias current value and the maximum bias current value.

7. The method according to claim 1, further comprising the step of:

designing the linear control loop circuit with a time constant characteristic at least one thousand times slower than another time constant characteristic of the phase-locked loop circuit.

8. The method according to claim 7, wherein the designing step further comprises the step of:

designing a resistance-capacitance characteristic of the linear control loop circuit to be at least one thousand times slower than another resistance-capacitance characteristic of the phase-locked loop circuit.

9. The method according to claim 1, wherein the linear control loop circuit is an analog, voltage control loop circuit.

10. A phase-locked loop circuit having a tuning voltage controlled to an optimal value, comprising:

a phase detector, a filter, a voltage-to-current converter, a current adder, and a current-controlled oscillator coupled together in series wherein the phase detector receives as an input a signal having a reference phase value that is an optimal value and wherein an output of the current-controlled oscillator is received as another input of the phase detector; and a linear control loop circuit coupled to the current adder and a tuning voltage of the voltage-to-current converter wherein a minimum bias current value and a maximum bias current value are defined for a bias current of the linear control loop circuit and wherein the linear control loop circuit infinitely varies a current value for the current-controlled oscillator of the phase-locked loop circuit and wherein the current value is based on a tuning current of the phase-locked loop circuit and the bias current, that is able to infinitely vary in value between the minimum bias current value and the maximum bias current value, to direct the tuning voltage to the optimal value.

11. The phase-locked loop circuit according to claim 10, wherein the current value is infinitely varied to fix the tuning voltage to the optimal value.

12. The phase-locked loop circuit according to claim 10, wherein the linear control loop circuit further comprises:
   a voltage summer, another filter, and another voltage-to-current converter coupled together in series;
   wherein both a reference voltage that is the optimal value and the tuning voltage are inputted into the voltage summer;
   wherein the voltage summer determines a voltage difference between the reference voltage and the tuning voltage;
   wherein the another filter filters the voltage difference;
   wherein the another voltage-to-current converter converts the voltage difference into the bias current; and
   wherein the bias current from the another voltage-to-current converter is injected into the tuning current from the voltage-to-current converter.

13. The phase-locked loop circuit according to claim 12, wherein the another voltage-to-current converter has a sufficient gain to provide the bias current between the minimum bias current value and the maximum bias current value.

14. The phase-locked loop circuit according to claim 10, wherein the linear control loop circuit has a time constant characteristic at least one thousand times slower than another time constant characteristic of the phase-locked loop circuit.

15. The phase-locked loop circuit according to claim 14, wherein the time constant characteristic is a resistance-capacitance characteristic and the another time constant characteristic is another resistance-capacitance characteristic.

16. The phase-locked loop circuit according to claim 10, wherein the linear control loop circuit is an analog, voltage control loop circuit.

17. A linear control loop circuit for controlling a tuning voltage of a phase-locked loop circuit to an optimal value, comprising:
   a voltage summer for determining a voltage difference between a reference voltage that is an optimal voltage value and a tuning voltage from a phase locked loop circuit;
   a loop filter coupled to the voltage summer for filtering the voltage difference; and
   a voltage-to-current converter coupled to the loop filter for converting a filtered voltage from the loop filter to a bias current that is infinitely varied and tuned among bias current values within a continual current range that is defined between a minimum bias current value and a maximum bias current value to direct the tuning voltage to the optimal value and that is injected into a tuning current of the phase-locked loop circuit.

18. The linear control loop circuit according to claim 17, wherein the loop filter is designed with a time constant characteristic at least one thousand times slower than another time constant characteristic of the phase-locked loop circuit.

19. A digital signal processing system, comprising:
   a phase locked loop circuit having a phase detector, a filter, a voltage-to-current converter, a current adder, and the current-controlled oscillator coupled together in series wherein the phase detector receives a reference phase value that is an optimal value as an input and wherein an output of the current-controlled oscillator is coupled to another input of the phase detector;
   a linear control loop circuit coupled to the phase locked loop circuit at the current adder and a tuning voltage of the voltage-to-current converter wherein a minimum bias current value and a maximum bias current value are defined for a bias current of the linear control loop circuit and wherein the linear control loop circuit infinitely varies a current value for a current-controlled oscillator of the phase-locked loop circuit wherein the current value is based on a tuning current of the phase-locked loop circuit and the bias current, that is able to infinitely vary in value between the minimum bias current value and the maximum bias current value, to direct the tuning voltage to the optimal value;
   a digital-to-analog converter and an analog-to-digital converter coupled to the phase locked loop circuit for converting between digital signals and analog signals;
   a microprocessor coupled to the phase locked loop circuit for controlling processing of the signals; and
   a digital signal processing core coupled to the phase locked loop circuit for processing the digital signals; and
   wherein the phase locked loop circuit provides a synchronous clock for the components of the digital signal processing system.

* * * * *